(12) United States Patent
Park et al.

(10) Patent No.: US 10,194,524 B1
(45) Date of Patent: Jan. 29, 2019

(54) ANTI-PAD FOR SIGNAL AND POWER VIAS IN PRINTED CIRCUIT BOARD

(71) Applicant: CISCO TECHNOLOGY, INC., San Jose, CA (US)

(72) Inventors: Il-Young Park, Fremont, CA (US); Jayanthi Natarajan, Sunnyvale, CA (US)

(73) Assignee: Cisco Technology, Inc., San Jose, CA (US)

( * ) Notice: Subject to any disclaimer, the term of this patent is extended or adjusted under 35 U.S.C. 154(b) by 0 days.

(21) Appl. No.: 15/660,536

(22) Filed: Jul. 26, 2017

(51) Int. Cl.
*H05K 1/02* (2006.01)
*H05K 1/11* (2006.01)

(52) U.S. Cl.
CPC ......... *H05K 1/0218* (2013.01); *H05K 1/0245* (2013.01); *H05K 1/115* (2013.01); *H05K 2201/09627* (2013.01)

(58) Field of Classification Search
CPC ...... H05K 1/115; H05K 1/116; H05K 1/0218; H05K 1/0222; H05K 1/0245; H05K 2201/093; H05K 2201/09609; H05K 2201/0969; H05K 2201/09627; H05K 2201/09309; H05K 2201/09318; H01L 23/49838

See application file for complete search history.

(56) References Cited

U.S. PATENT DOCUMENTS

| | | | | |
|---|---|---|---|---|
| 5,544,018 A * | 8/1996 | Sommerfeldt | ...... | H01L 23/5382 361/792 |
| 6,084,779 A * | 7/2000 | Fang | ...... | H05K 1/0216 174/255 |
| 6,442,041 B2 * | 8/2002 | Rehm | ...... | H01L 23/5383 174/255 |
| 6,559,733 B2 * | 5/2003 | Larson | ...... | H01P 1/268 361/700 |
| 6,744,130 B1 * | 6/2004 | Miller | ...... | H01L 23/66 257/691 |
| 7,069,650 B2 * | 7/2006 | Wyrzykowska | ...... | H05K 1/112 361/780 |
| 7,173,193 B2 | 2/2007 | Brodsky et al. | | |
| 7,259,336 B2 * | 8/2007 | Wyrzykowska | ...... | H05K 1/112 257/778 |
| 7,448,880 B2 * | 11/2008 | Osaka | ...... | H01L 23/49838 257/E23.07 |
| 7,633,766 B2 | 12/2009 | Regnier et al. | | |

(Continued)

FOREIGN PATENT DOCUMENTS

CN   103442513   12/2013

*Primary Examiner* — Chau N Nguyen
*Assistant Examiner* — Roshn K Varghese
(74) *Attorney, Agent, or Firm* — Cindy Kaplan

(57) ABSTRACT

In one embodiment, an apparatus includes a plurality of layers in a printed circuit board comprising at least one power plane and at least one ground plane, and a plurality of vias extending through the plurality of layers and connecting two or more of the layers, the plurality of vias comprising at least one pair of differential signal vias and at least one pair of power vias, the signal vias and power vias surrounded by a plurality of ground vias. The ground plane includes an anti-pad formed therein by an opening defined by removal of material, with the pair of differential signal vias and pair of power vias extending through the anti-pad in the ground plane to reduce power via resonance.

16 Claims, 8 Drawing Sheets

(56) References Cited

U.S. PATENT DOCUMENTS

| | | | |
|---|---|---|---|
| 7,830,223 B2 | 11/2010 | Ahmad | |
| 2004/0041277 A1* | 3/2004 | Kimura | H01L 23/49838 257/778 |
| 2004/0216071 A1* | 10/2004 | Miller | G06F 17/5077 257/E23.07 |
| 2008/0073113 A1 | 3/2008 | Senk et al. | |
| 2008/0169125 A1* | 7/2008 | Hsu | H01R 23/688 174/263 |
| 2008/0185180 A1 | 8/2008 | Cheng et al. | |
| 2010/0065321 A1* | 3/2010 | Kashiwakura | H05K 1/0222 174/261 |
| 2010/0244871 A1 | 9/2010 | Blair et al. | |
| 2011/0079422 A1* | 4/2011 | Kushita | H05K 1/0245 174/266 |
| 2013/0005160 A1* | 1/2013 | Minich | H01R 13/6471 439/65 |
| 2015/0359084 A1* | 12/2015 | Kashiwakura | H01P 3/026 333/246 |
| 2016/0150645 A1* | 5/2016 | Gailus | H05K 1/0222 174/266 |
| 2016/0154924 A1* | 6/2016 | Ozawa | G06F 17/5081 716/115 |

* cited by examiner

ANTI-PAD FOR SIGNAL AND POWER VIAS IN PRINTED CIRCUIT BOARD

TECHNICAL FIELD

The present disclosure relates generally to electronic components, and more specifically, to circuit board configurations for high-speed applications.

BACKGROUND

Printed Circuit Boards (PCBs) are used in a wide variety of electrical devices. PCBs include multiple layers of conductors, which are interconnected by metallized holes, referred to as vias. Power is delivered to integrated circuits such as high-speed ASICs (Application Specific Integrated Circuits) from PCB power planes through interface vias. Multiple power vias may be utilized to distribute needed levels of current or to feed different functional sections of a silicon chip. As the circuit density on printed circuit boards increases and signal speeds increase, issues such as resonating modes may arise that could affect the quality of high-speed signals and increase the bit error rate.

BRIEF DESCRIPTION OF THE FIGURES

Corresponding reference characters indicate corresponding parts throughout the several views of the drawings.

DESCRIPTION OF EXAMPLE EMBODIMENTS

Overview

Figure 1A:
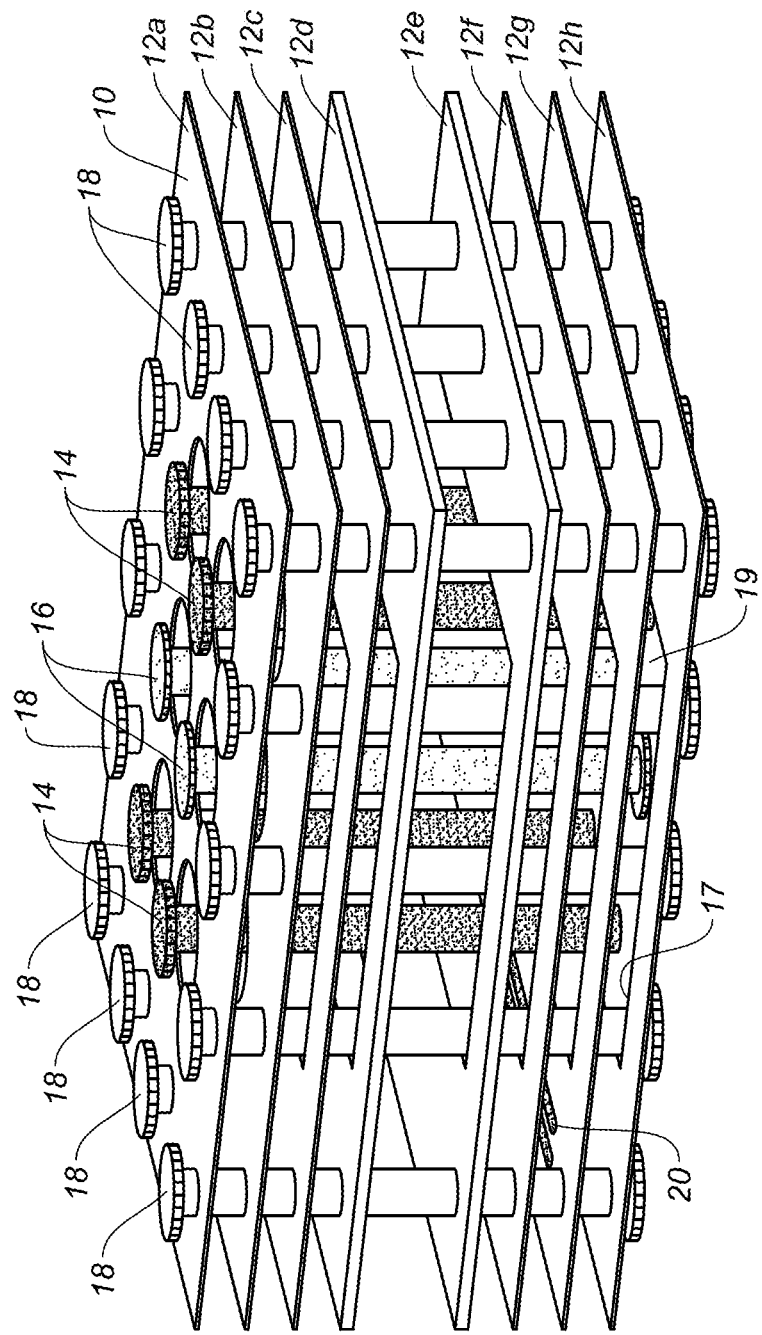
FIG. 1A is a perspective view of a circuit board structure comprising a signal and power anti-pad, in accordance with one embodiment.

In one embodiment, an apparatus generally comprises a plurality of layers in a printed circuit board comprising at least one power plane and at least one ground plane, and a plurality of vias extending through the plurality of layers and connecting two or more of the layers, the plurality of vias comprising at least one pair of differential signal vias and at least one pair of power vias, the signal vias and power vias surrounded by a plurality of ground vias. The ground plane includes an anti-pad formed therein by an opening defined by removal of material, with the pair of differential signal vias and pair of power vias extending through the anti-pad in the ground plane to reduce power via resonance.

In another embodiment, a printed circuit board generally comprises a plurality of layers comprising at least one power plane and at least one ground plane, a plurality of vias extending at least partially through the plurality of layers, the plurality of vias comprising at least one pair of differential signal vias and at least one pair of power vias, the signal vias and power vias surrounded by a plurality of ground vias, and a bridging trace extending between the pair of power vias in at least one of the layers. The ground plane includes an anti-pad formed therein by an opening defined by removal of material, with the pair of differential signal vias and pair of power vias extending through the anti-pad in the ground plane to reduce power via resonance.

In yet another embodiment, an apparatus generally comprises a plurality of layers comprising at least one power plane and at least one ground plane, the plurality of layers forming a printed circuit board, and a plurality of vias extending through the plurality of layers and connecting two or more of the layers, the plurality of vias comprising two pairs of differential signal vias and one pair of power vias interposed between the two pairs of differential signal vias, the pairs of signal vias and power vias surrounded by a plurality of ground vias. The ground plane includes an anti-pad formed therein by an opening defined by removal of material, with the pair of differential signal vias and pair of power vias extending through the anti-pad in the ground plane to reduce power via resonance.

EXAMPLE EMBODIMENTS

The following description is presented to enable one of ordinary skill in the art to make and use the embodiments. Descriptions of specific embodiments and applications are provided only as examples, and various modifications will be readily apparent to those skilled in the art. The general principles described herein may be applied to other applications without departing from the scope of the embodiments. Thus, the embodiments are not to be limited to those shown, but are to be accorded the widest scope consistent with the principles and features described herein. For purpose of clarity, details relating to technical material that is known in the technical fields related to the embodiments have not been described in detail.

Printed Circuit Board (PCB) power planes often deliver power through BGA (Ball Grid Array) interface vias. Power may be supplied by a pair of adjacent vias placed closely to signal vias (e.g., high-speed differential signal vias). This configuration may be necessitated by advancing packaging density. Resonating modes may be generated in the power vias based on the location of the power plane layer and may cause insertion loss suck-out and crosstalk amplification, thereby causing bit drop and an increase in BER (Bit Error Rate). For example, high-speed differential signals surrounded by any number of power vias will typically have significant performance drop in insertion loss, return loss, and crosstalk amplification since power vias behave as resonators.

HSD (High-Speed Differential) signal performance degradation may be so significant that some HSD signals may experience bit drop, traffic failures, and inferior bit error rates. This performance degradation will get worse as HSD signals run faster. The frequencies of such resonances relate to the distance between the power plane and via intersection and the bottom of the associated via stubs (usually the other side of the PCB from the BGA pads). Such resonances may affect the quality of high-speed digital communication signals and could increase the BER in NRZ (Non-Return-to-Zero) signaling, for example.

The embodiments described herein provide an anti-pad configuration for signal and power vias. In one or more embodiments, the anti-pad may provide reduced crosstalk and improved signal quality through reduced insertion loss and return loss. One or more embodiments may also provide a smaller package size with a smaller BGA, thus reducing PCB costs. The embodiments may also provide for increased Ethernet/Fibre channel port density.

Figure 1B:
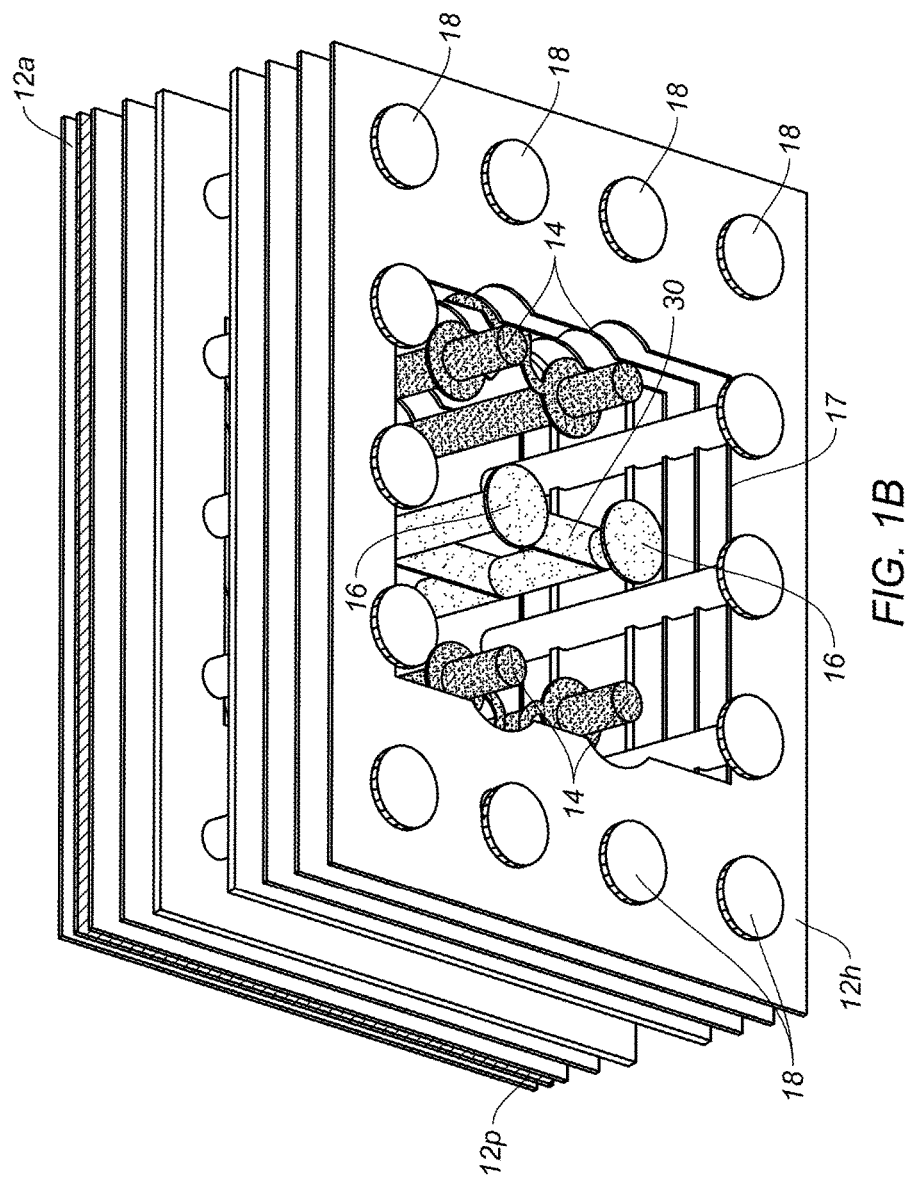
FIG. 1B is a bottom perspective view of the circuit board of FIG. 1A.

Referring now to the drawings, and first to FIGS. 1A and 1B, a perspective top view and bottom view, respectively, of one example of a circuit board structure 10 is shown. For clarity, at least some insulating material and layers have been removed in FIGS. 1A and 1B (and in bottom plan view of FIG. 2). The circuit board 10 (e.g., printed circuit board, printed wire board, portion of a circuit board, printed board, circuit board panel, printed circuit board assembly) comprises multiple layers (12a, 12b, 12c, 12d, 12e, 12f, 12g, 12h) of conductive and nonconductive materials, with each layer defining a plane of the circuit board. One or more nonconductive layers may have a surface coated with a conductive material. Portions of the conductive material may be removed to define conductive portions on the surface, which are referred to as traces 20. The traces 20 define circuit paths on the circuit board that make an electrical connection between two or more points on the PCB. The layers typically include at least one signal plane, at least one ground plane (e.g., 12c, 12d, 12h), and at least one power plane (12p in FIG. 1B). Outermost layers (top and bottom) of the PCB may have components mounted on their surfaces (not shown). In one example, the PCB may operate, for example, with data rates of 28 Gbps (or more or less) for NRZ signaling and 56 Gbps (or more or less) for PAM (Pulse Amplitude Modulation)-4 signaling.

The circuit board 10 further includes a plurality of through holes (vias) 14, 16, 18, through which the different conductive layers are connected together. The vias 14, 16, 18 typically extend through the entire thickness of the circuit board 10 and are plated along their interior surfaces. The through hole may, for example, be created using a drilling process and plated with a metallic material (e.g., copper or any conductive or metallic layer). The plating may effectively cover the barrel of the hole and interconnect the various conductive layers. The traces 20 may be connected through the vias. For example, the vias may interconnect traces on different PCB layers and connect layers to power or ground planes. As shown in FIGS. 1A and 1B, and the bottom plan view of FIG. 2, a pair of conductive traces 20 extend away from signal vias 14 and in differential signal applications, two of the traces define a differential signal transmission line that leads to a connector, electronic component, or another element.

Figure 2:
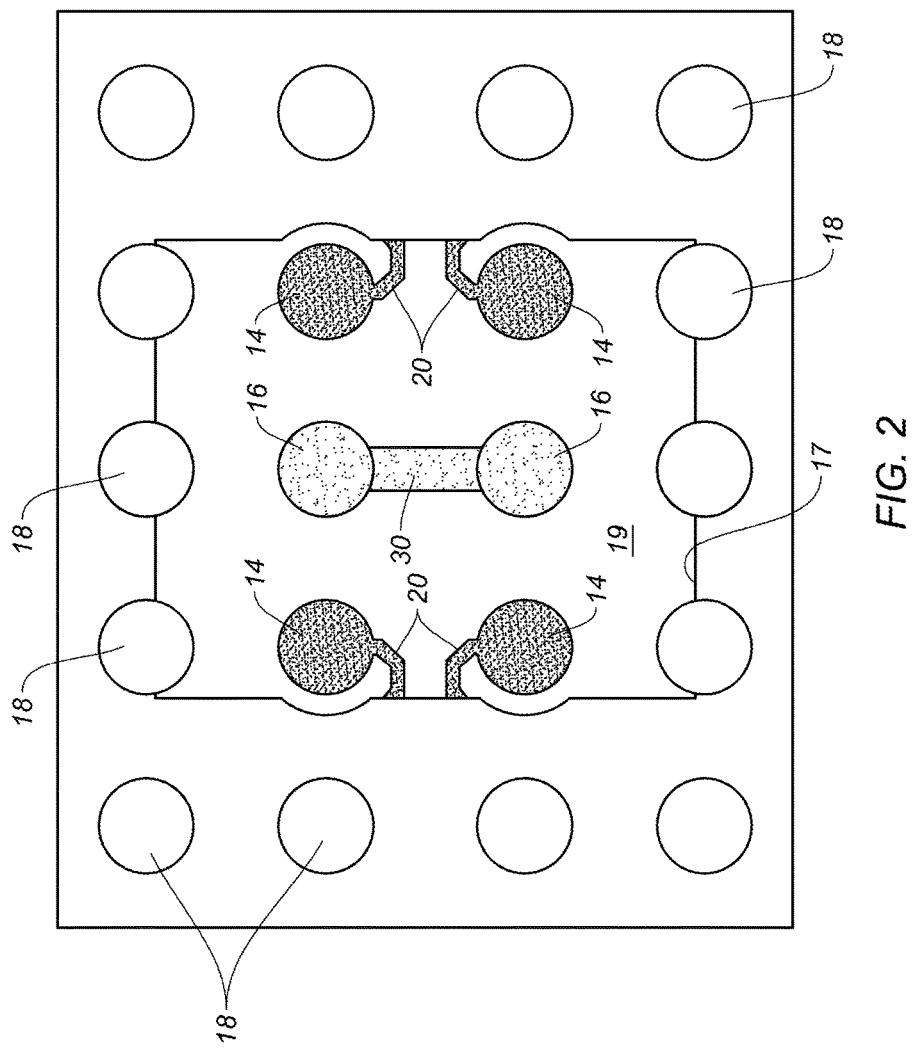
FIG. 2 is a partial bottom plan view of the circuit board shown in FIGS. 1A and 1B.

In the example shown in FIGS. 1A, 1B, and 2, the circuit board 10 includes two pairs of signal vias 14, with a pair of power vias 16 interposed therebetween. The group of signal vias 14 and power vias 16 are surrounded by ground vias 18. Power is supplied by the pair of adjacent power vias 16, which are placed close to the signal vias 14 (e.g., high-speed differential signal vias) due to packaging density constraints. In one embodiment, the vias are aligned in rows with each via pair spaced apart and the power vias spaced equidistant from the signal vias (e.g., approximately 1.27 mm, 1 mm, 0.8 mm, or any other distance from each signal via). The ground vias 18 surround the group of signal vias 14 and power vias 16 and may be aligned in rows, as shown in FIG. 2. In one example, each ground via is spaced approximately 1.27 mm, 1 mm, 0.8 mm, or any other distance from each signal via from its adjacent power or signal via. It is to be understood that the arrangement of vias shown in FIGS. 1A, 1B, and 2 and described herein is only an example and other via arrangements or number of vias may be used, without departing from the scope of the embodiments.

As previously described, this configuration may generate resonating modes in the power vias 14 depending on the location of the power plane layers. In one embodiment, an anti-pad 19 is used to suppress power via resonance and reduce cross-talk amplification. The anti-pad 19 may be used, for example, to suppress energy transfer among power vias 16, and victim HSD and aggressor HSD signal vias 14. The anti-pad 19 is a clearance area in a plane (e.g., copper plane) through which holes may be drilled or otherwise pass without making a connection (e.g., clearance between vias 14, 16 and metal layer to which they are not connected). The anti-pad 19 may be associated with one or more ground planes (e.g., 12c, 12d, 12e, 12h) and enables a plurality of vias 14, 16 to pass through the ground plane substantially without contacting copper associated with the layer. A portion of the underlying ground plane area that surrounds the signal vias 14 and power vias 16 is removed to form an opening, referred to as the anti-pad. At least one ground plane (layer) (e.g., 12h in FIG. 2) includes the anti-pad 19 formed therein by an opening 17 defined by removal of material, with the pairs of differential signal vias 14 and pair of power vias 16 extending through the anti-pad in the ground plane.

As shown in FIGS. 1A, 1B, and the bottom plan view in FIG. 2, the single large anti-pad 19 (also referred to herein as a signal and power anti-pad, signal via and power via anti-pad, or monster anti-pad) is maintained about both the signal vias 14 and power vias 16. In the example shown in FIG. 2, the anti-pad 19 is generally rectangular in shape. The embodiments described herein combine anti-pads for signal and power vias 14, 16 into one large anti-pad, which surrounds both signal and power vias (e.g., two pairs of high-speed differential signal vias 14 and one pair of power vias 16). The anti-pad 19 may enable a portion of each signal via 14 and power via 16 to pass through one or more layers without contacting copper associated with the layer. The power and signal anti-pad 19 reduces power via resonance and cross-talk between signals transmitted in the signal vias.

As shown in FIGS. 1A and 1B, the anti-pad 19 may be implemented (formed) in any number of ground planes. The anti-pad 19 may be implemented in any layer including, top, bottom, or inner layers, and any number of layers (planes) (e.g., 1, 2, 3, 4, . . . ), which may be adjacent to one another or separated by other layers. In one embodiment, the anti-pad 19 is implemented on one or more ground planes disposed below the power plane. (It is to be understood that the term "below" as used herein is a relative term based on the position of the circuit board in its operating environment). The number of ground planes in which the anti-pad 19 is located may be determined by simulations, for example.

One or more layers in which the large signal and power anti-pad 19 is not formed may comprise conventional generally round anti-pads individually surrounding each via, for example.

Figure 3:
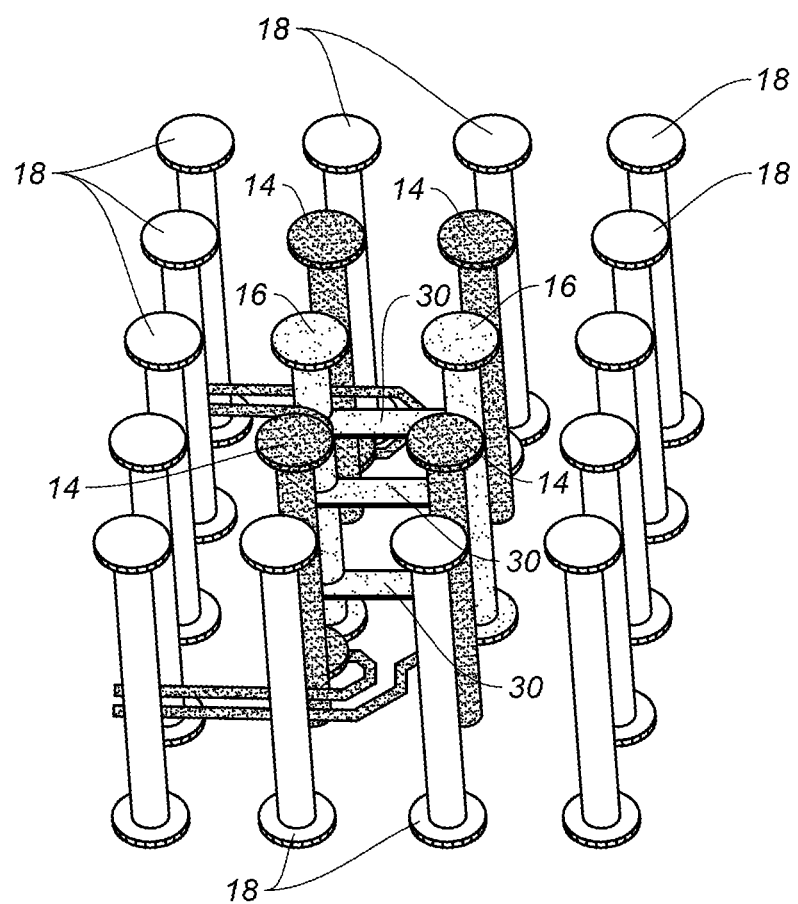
FIG. 3 is a perspective showing bridging traces located between power vias, in accordance with one embodiment.

In one or more embodiments, one or more bridging traces 30 may be located between the power vias 16, as shown in FIGS. 2 and 3. FIG. 3 shows, for illustration purposes, the vias 14, 16, 18, without the layers. The power via stub impact described above may be reduced by adding traces 30 between the power vias 16. The number of traces 30 and location of traces may vary according to the stack up or routing layer of signal and target data rate, for example. The bridging trace 30 improves the power via stub impact without additional cost in the PCB, such as may be associated with back-drilling power via stub or printed circuit board layer count increase to add additional power plane layers. Moreover, there is no need for a decoupling capacitor between the power pad and ground pad to be removed, thereby avoiding any compromise on power delivery. Any number of traces 30 may be provided between the power vias 16 (e.g., one trace, three traces, etc.). The traces 30 may be added, for example, to an inner or bottom layer of the printed circuit board, while preserving decoupling capacitors for power delivery.

Figure 4:
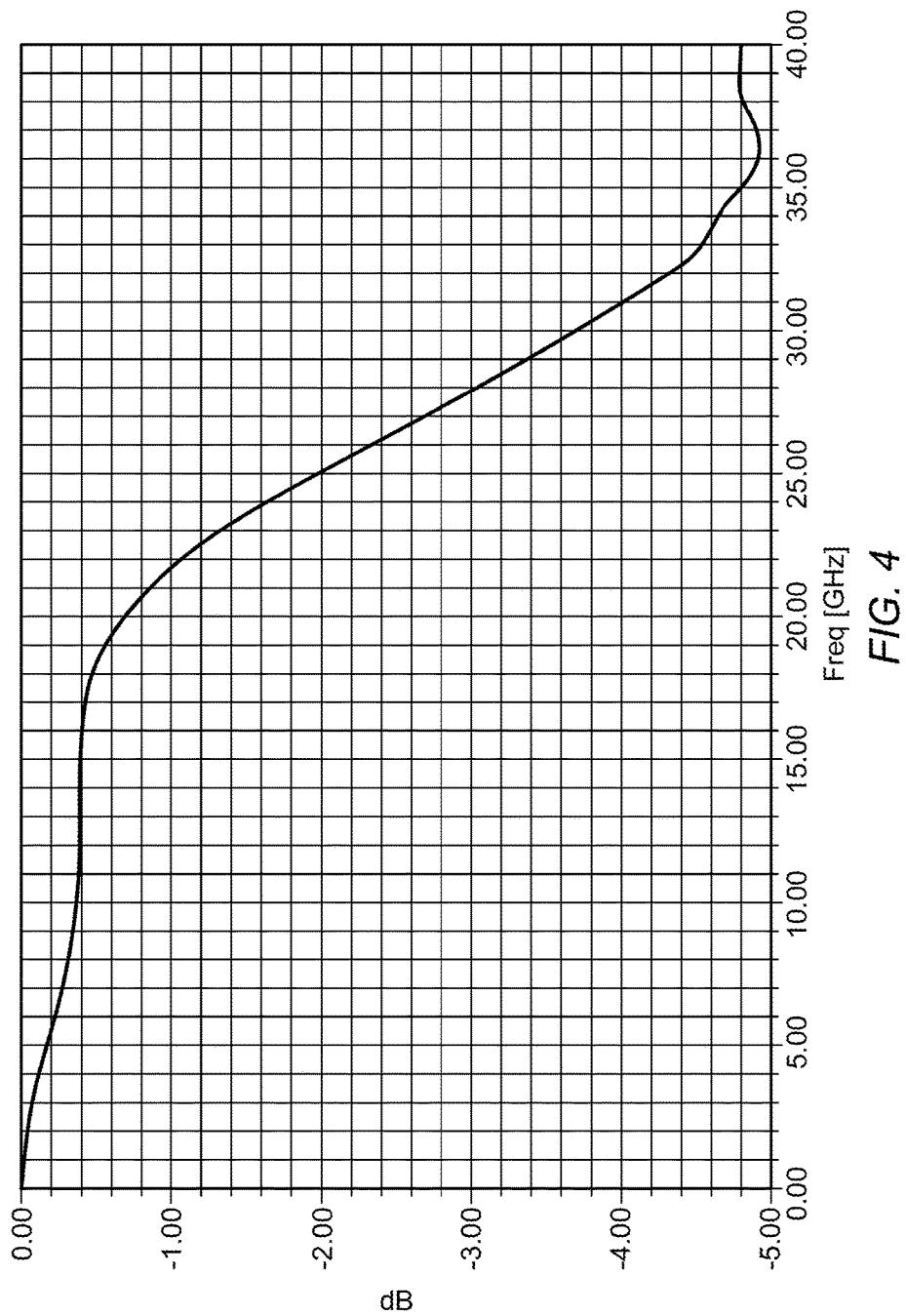
FIG. 4 is a graph illustrating differential insertion loss for a circuit board comprising the signal and power anti-pad.
Figure 5:
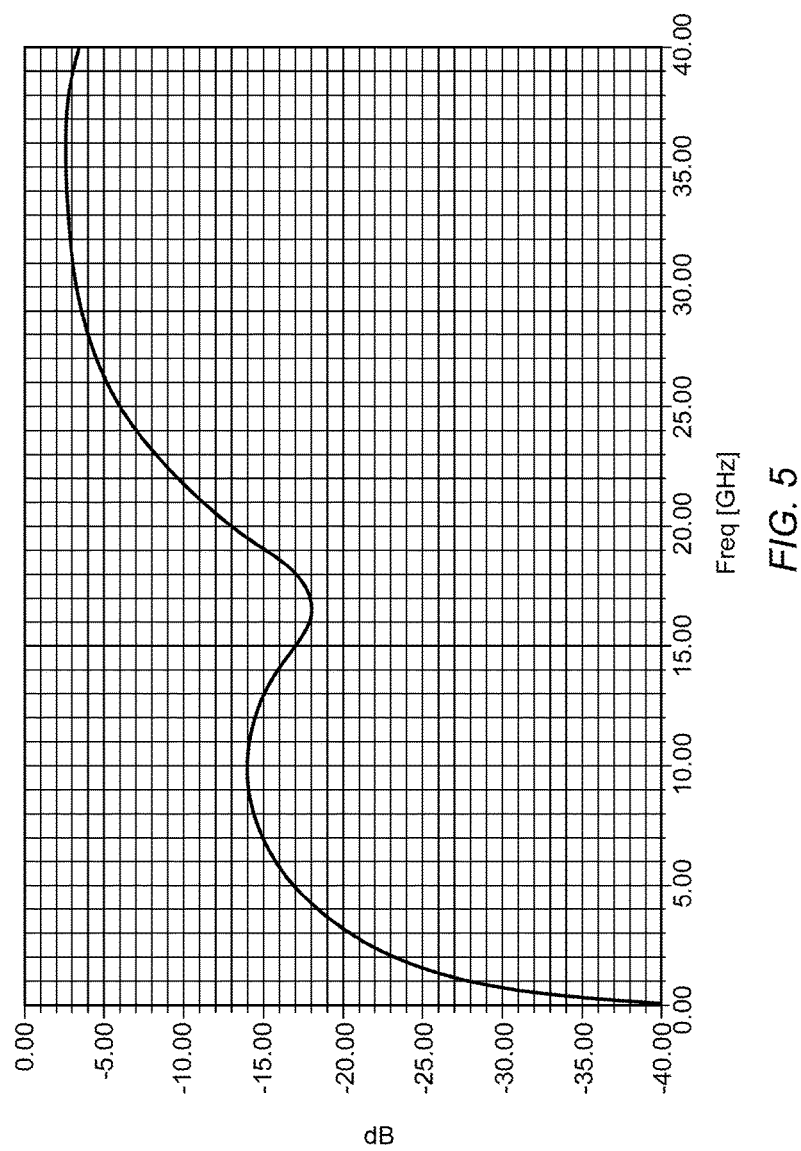
FIG. 5 is a graph illustrating differential return loss for a circuit board comprising the signal and power anti-pad.

FIGS. 4-7 illustrate simulated performance analysis. FIGS. 4 and 5 illustrate differential insertion loss and differential return loss, respectively. Insertion loss (FIG. 4) refers to the loss of signal power resulting from the insertion of a device in a transmission line and is expressed in decibels (dB). Differential return loss (FIG. 5) refers to the loss of power in the signal returned by a discontinuity in a transmission line and is expressed in dB. One or more embodiments have less capacitance coupling between plane and vias as compared to a configuration of HSD signal with ground and makes PCB via footprint optimization easier where capacitance is more dominant than inductance.

Figure 6:
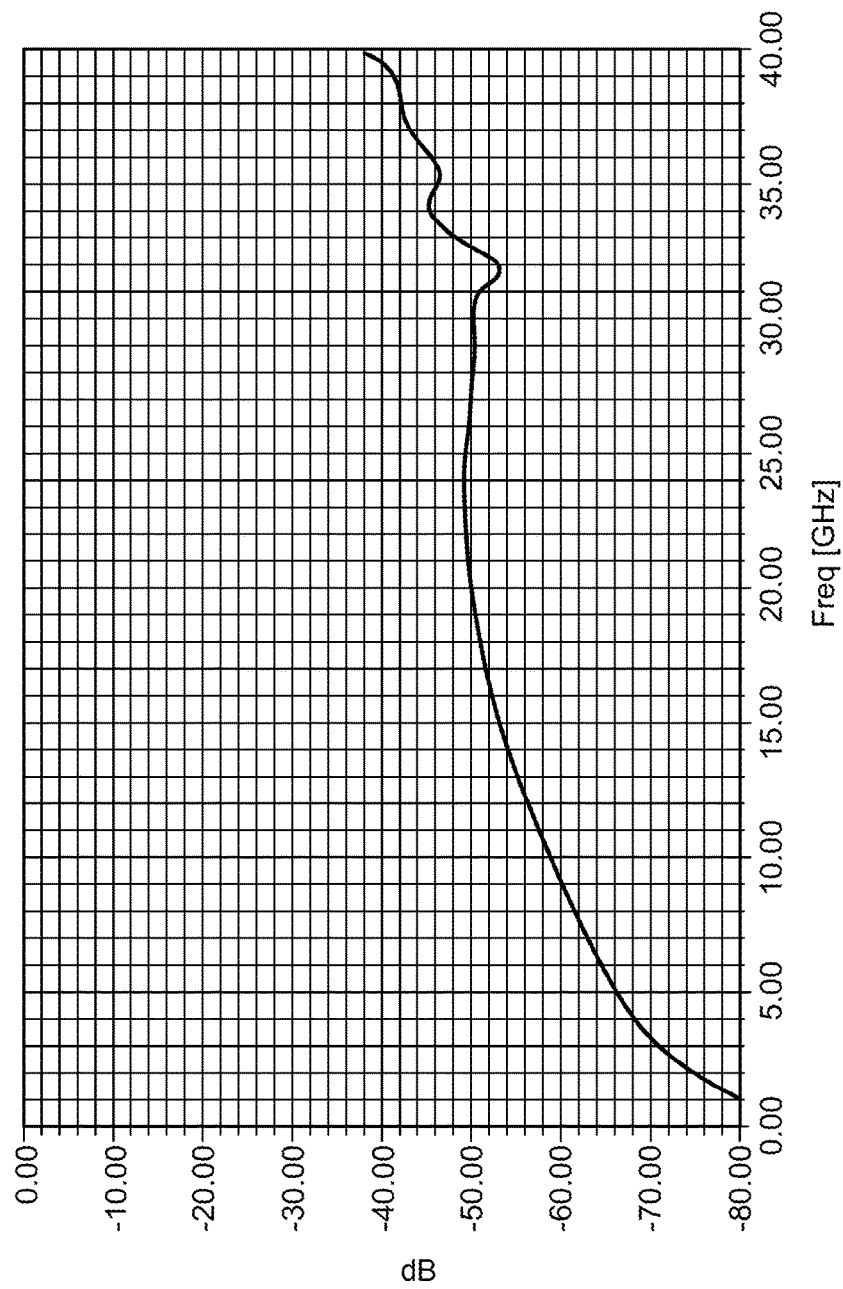
FIG. 6 is a graph illustrating far-end cross talk for a circuit board comprising the signal and power anti-pad.
Figure 7:
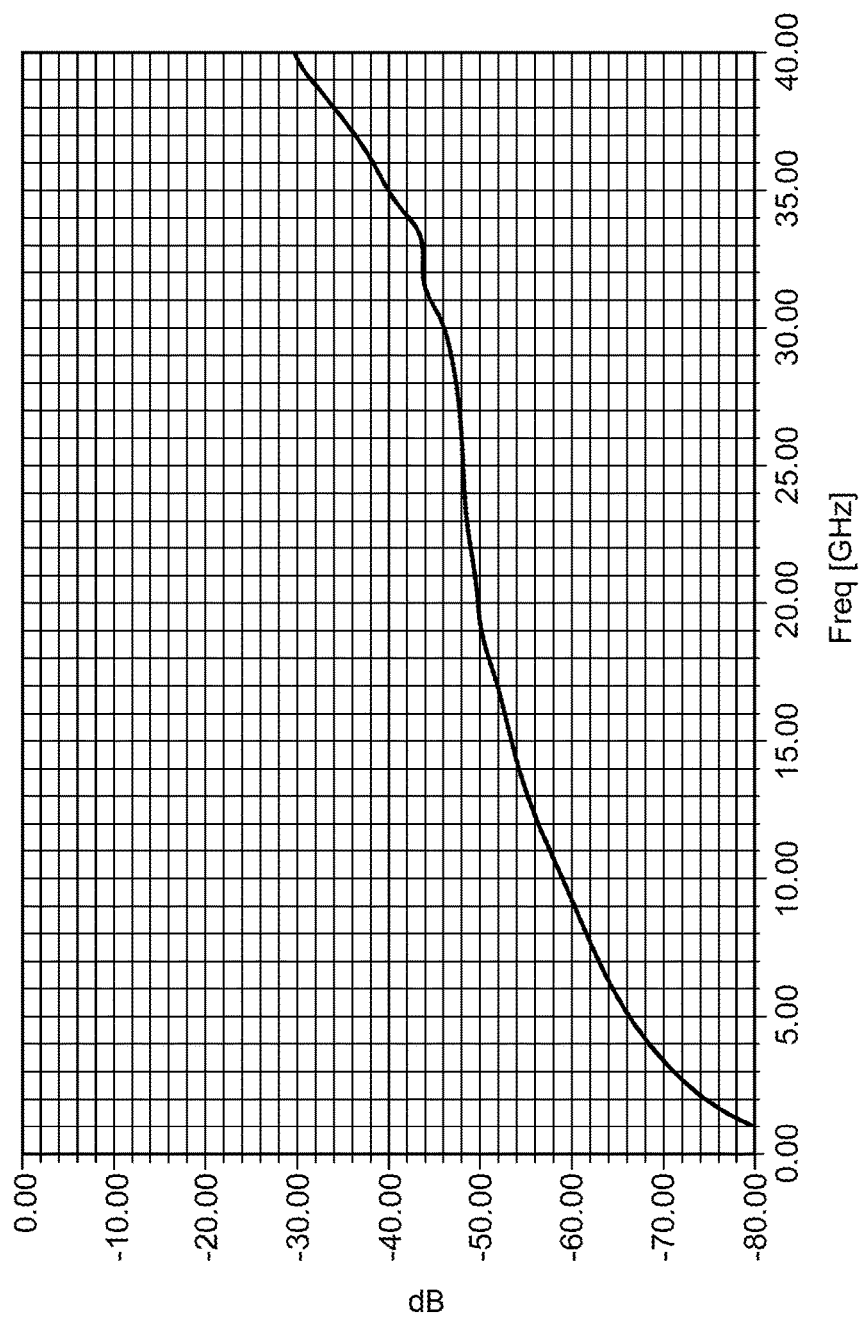
FIG. 7 is a graph illustrating near-end cross talk for a circuit board comprising the signal and power anti-pad.

FIGS. 6 and 7 illustrate differential far-end crosstalk and differential near-end crosstalk, respectively. Crosstalk may be caused, for example, by undesired capacitance or coupling from one circuit to another. Near-end crosstalk refers to interference at the same end as the interfering transmitter. Far-end crosstalk refers to interference at the other end with respect to the interfering transmitter. In one example, the signal and power anti-pad 19 may push down crosstalk up to 10 dB compared with conventional systems and achieve crosstalk levels as good as HSD vias surrounded by ground vias up to 20-25 GHz. One or more embodiments deliver far-end crosstalk as good as HSD signal vias surrounded by ground vias up to 20 GHz and have lower far-end crosstalk than conventional systems up to 26 GHz. One or more embodiments provide near-end crosstalk as good as HSD signal vias surrounded by ground vias up to 28 GHz and lower near-end crosstalk than conventional systems up to 30 GHz.

Although the apparatus has been described in accordance with the embodiments shown, one of ordinary skill in the art will readily recognize that there could be variations made without departing from the scope of the embodiments. Accordingly, it is intended that all matter contained in the above description and shown in the accompanying drawings shall be interpreted as illustrative and not in a limiting sense.

What is claimed is:

1. An apparatus comprising: a plurality of layers in a printed circuit board comprising at least one power plane and at least one ground plane; a plurality of vias extending through said plurality of layers and connecting two or more of said layers, said plurality of vias comprising two pairs of differential signal vias and at least one pair of power vias interposed between said two pairs of differential signal vias, each of said pairs of differential signal vias aligned in a row with said pair of power vias; a plurality of ground vias surrounding said at least one pair of differential signal vias and said at least one pair of power vias; a bridging trace extending between said pair of power vias; wherein said ground plane comprises an anti-pad formed therein by an opening defined by removal of material, said two pairs of differential signal vias and said at least one pair of power vias extending through said anti-pad in said ground plane to reduce power via resonance; and at least one via extending through said ground plane and located outside of the anti-pad.

2. The apparatus of claim 1 further comprising a plurality of bridging traces extending between said power vias.

3. The apparatus of claim 1 wherein said at least one pair of differential signal vias comprises a pair of high-speed differential signal vias for operation with data rates of at least 28 Gbps.

4. The apparatus of claim 1 wherein said anti-pad is formed in said ground plane to reduce crosstalk between signals in said signal vias.

5. The apparatus of claim 1 wherein said anti-pad extends to at least two adjacent rows of said ground vias.

6. The apparatus of claim 1 wherein said anti-pad is formed in a plurality of ground planes disposed below the power plane.

7. A printed circuit board comprising: a plurality of layers comprising at least one power plane and at least one ground plane; a plurality of vias extending at least partially through said plurality of layers, said plurality of vias comprising two pairs of differential signal vias and at least one pair of power vias interposed between said two pairs of differential signal vias, said at least one pair of differential signal vias and said at least one pair of power vias surrounded by a plurality of ground vias, each of said pairs of differential signal vias aligned in a row with said pair of power vias; a bridging trace extending between said pair of power vias; wherein said ground plane comprises an anti-pad formed therein by an opening defined by removal of material, said at least one pair of differential signal vias and said at least one pair of power vias extending through said anti-pad in said ground plane to reduce power via resonance; and at least one via extending through said ground plane and located outside of the anti-pad.

8. The printed circuit board of claim 7 wherein said bridging trace comprises a plurality of traces extending between said power vias.

9. The printed circuit board of claim 7 wherein said at least one pair of differential signal vias comprises a pair of high-speed differential signal vias for operation with data rates of at least 28 Gbps.

10. The printed circuit board of claim 7 wherein said anti-pad is formed in said ground plane to reduce crosstalk between signals in said signal vias.

11. The printed circuit board of claim 7 wherein said anti-pad extends to at least two adjacent rows of said ground vias.

12. The printed circuit board of claim 7 wherein said anti-pad is formed in a plurality of ground planes disposed below the power plane.

13. An apparatus comprising: a plurality of layers comprising at least one power plane and at least one ground plane, said plurality of layers forming a printed circuit board; a plurality of vias extending through said plurality of layers and connecting two or more of said layers, said plurality of vias comprising two pairs of differential signal vias and one pair of power vias interposed between said two pairs of differential signal vias, said differential signal vias and power vias surrounded by a plurality of ground vias, each of said pairs of differential signal vias aligned in a row with said pair of power vias; a bridging trace extending between said pair of power vias; wherein said ground plane comprises an anti-pad formed therein by an opening defined by removal of material, said at least one pair of differential signal vias and said at least one pair of power vias extending through said anti-pad in said ground plane to reduce power via resonance and crosstalk between signals; and at least one via extending through said ground plane and located outside of the anti-pad.

14. The apparatus of claim 13 wherein said differential signal vias comprises high-speed differential signal vias for operation with data rates of at least 28 Gbps.

15. The apparatus of claim 13 wherein said anti-pad extends to at least two adjacent rows of said ground vias.

16. The apparatus of claim 13 wherein said anti-pad is generally rectangular and is formed in a plurality of ground planes.

* * * * *